United States Patent [19]

Seidler

[11] Patent Number: 5,307,929
[45] Date of Patent: May 3, 1994

[54] LEAD ARRANGEMENT FOR INTEGRATED CIRCUITS AND METHOD OF ASSEMBLY

[75] Inventor: Jack Seidler, Flushing, N.Y.

[73] Assignee: North American Specialties Corporation, Flushing, N.Y.

[ * ] Notice: The portion of the term of this patent subsequent to Jan. 5, 2010, has been disclaimed.

[21] Appl. No.: 945,861

[22] Filed: Sep. 16, 1992

Related U.S. Application Data

[63] Continuation-in-part of Ser. No. 717,681, Jun. 19, 1991, Pat. No. 5,176,255.

[51] Int. Cl.$^5$ .................. H01R 9/22; B65D 73/02
[52] U.S. Cl. ..................... 206/331; 29/827; 29/843; 29/884; 206/330; 228/212
[58] Field of Search ............. 29/827, 842, 843, 884; 228/180.2, 212; 206/328, 330, 331; 257/666, 674, 676

[56] References Cited

U.S. PATENT DOCUMENTS

| | | | |
|---|---|---|---|
| 2,830,698 | 4/1958 | Goda et al. | 206/330 |
| 3,702,954 | 11/1972 | Mosch et al. | 257/674 |
| 3,908,075 | 9/1975 | Jackson et al. | 228/180 A |
| 4,054,238 | 10/1977 | Lloyd et al. | 29/827 |
| 4,728,589 | 11/1988 | Dennis | 29/827 |

FOREIGN PATENT DOCUMENTS

| | | | |
|---|---|---|---|
| 54-104787 | 8/1979 | Japan | 257/666 |
| 63-228657 | 9/1988 | Japan | 257/666 |

*Primary Examiner*—P.W. Echols
*Attorney, Agent, or Firm*—Darby & Darby

[57] ABSTRACT

A lead arrangement is provided having a number of leads to be mechanically and electrically connected to a substrate. Retaining means are also provided integral with the lead arrangement to hold the substrate against the leads, as during soldering. The retaining means may be disengaged from the substrate separately or simultaneously with the trimming of the leads from the lead arrangement after connecting to the substrate.

25 Claims, 6 Drawing Sheets

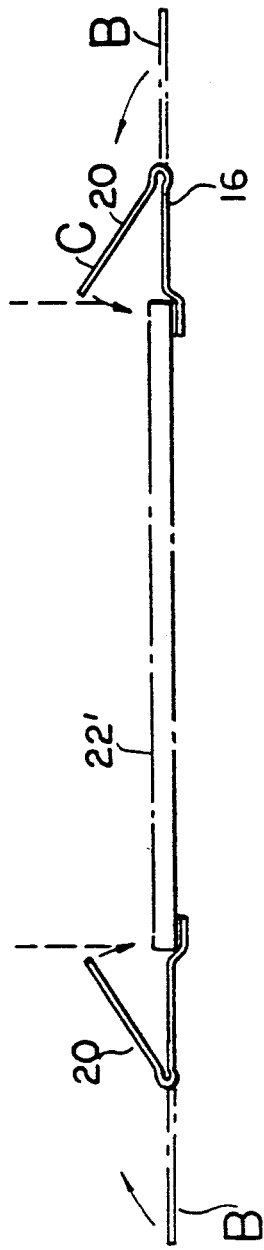

LEAD ARRANGEMENT FOR INTEGRATED CIRCUITS AND METHOD OF ASSEMBLY

The present application is a continuation-in-part of application Ser. No. 717,681, filed Jun. 19, 1991 for lead frame for integrated circuits and the like, now U.S. Pat. No. 5,176,255, issued Jan. 5, 1993.

FIELD OF THE INVENTION

This invention relates generally to lead arrangements for and methods for applying lead s to a circuit-bearing substrates. More specifically, the invention relates to a strip or frame for applying single or multiple leads simultaneously to integrated circuit chips or chip carriers, and methods of producing and applying such lead arrangements.

BACKGROUND OF THE INVENTION

In the manufacture of electronic devices, it is frequently desirable to combine two components—a substrate, which may, for example, be an integrated circuit (IC) chip or a chip carrier, and a number of leads that create connections between the substrate and the surrounding electronic circuitry. The leads are connected to the substrate at its contact pads, which are exposed electrically conductive areas, usually at an edge or periphery of one face of the substrate.

The speed at which the leads are attached to the substrate is a paramount consideration in the manufacturing process, as higher throughput and thus lower costs can provide the economy needed for successfully meeting competition. Technologies have been designed to attempt to speed the process. A process in common use includes forming a frame or strip with a number of individual leads spaced to correspond to contact pads on the substrate. Solder is then applied to the contact pads on the substrate or the leads. The frame or strip is positioned adjacent the substrate, putting the leads in juxtaposition or direct contact with respective contact pads. In order to hold the leads in contact with their pads during soldering, the substrate is pressed onto the leads. Unfortunately, this can sometimes crack the substrate, which renders it unusable. While being held under pressure, the frame/substrate assembly is heated, causing the solder to melt and, upon cooling, creates an electrical and physical connection between the leads and the substrate.

Typically, heat is applied to the underside of the leads for three to four seconds, melting the solder, which flows between the contact pads and the leads. To prevent movement of the leads while the solder remains in a liquid state, which could result in misalignment and misconnection of the leads, a support and clamp remain in position, holding the components in place until the solder has sufficiently cooled. Typically, this may take about fifteen seconds. Overall, this process requires that a particular lead frame and substrate remain at the soldering station for about 20 seconds.

After soldering is completed, the lead frame is cut away, leaving the ends of the leads extending from the periphery of the substrate, ready for connection to surrounding electronic devices. A similar procedure is used for a linear strip array of leads.

The time required at the soldering station for each substrate makes the manufacturing speed and thus the throughput undesirably low for competitive production. Also, the substantial risk of cracking a substrate and having to completely discard the unit adds to the costs involved.

Thus, it is an object of the invention to provide a lead arrangement (which may be in the form of a frame or strip) that decreases the time the frame or strip and substrate must remain at a soldering station.

It is another object of the invention to provide a lead arrangement that includes means for retaining a substrate against the leads while the solder cools, without risk of damaging the substrate.

It is a further object of the invention to provide a lead arrangement including means for retaining a substrate against the leads during soldering, where the retaining means is formed integrally with the leads and is readily removed at the end of the manufacturing process.

It is yet another object of the invention to provide a lead arrangement that is economical to fabricate and produces significant savings in applying leads to substrates, in decreased time.

SUMMARY OF THE INVENTION

In accordance with the objects of the invention, a lead arrangement is provided having a number of leads to be mechanically and electrically connected to a substrate. Retaining means are also provided on the lead arrangement to hold the substrate against the leads during soldering and subsequent cooling. The retaining means is preferably disengaged from the substrate simultaneously with the trimming of the leads from the arrangement.

The foregoing and other objects and advantages of this invention will become apparent to those skilled in the art from the detailed description of a preferred embodiment in conjunction with a review of the appended drawings.

BRIEF DESCRIPTION OF THE DRAWINGS

FIG. 4 is a side view of a lead frame with retaining arms prepared to receive a substrate;

FIG. 5 is a side detail view of the retaining means of FIG. 4 according to the invention;

FIG. 7 is a side view of an alternate embodiment of a lead frame according to my invention;

DETAILED DESCRIPTION OF THE PREFERRED EMBODIMENTS

Figure 1:
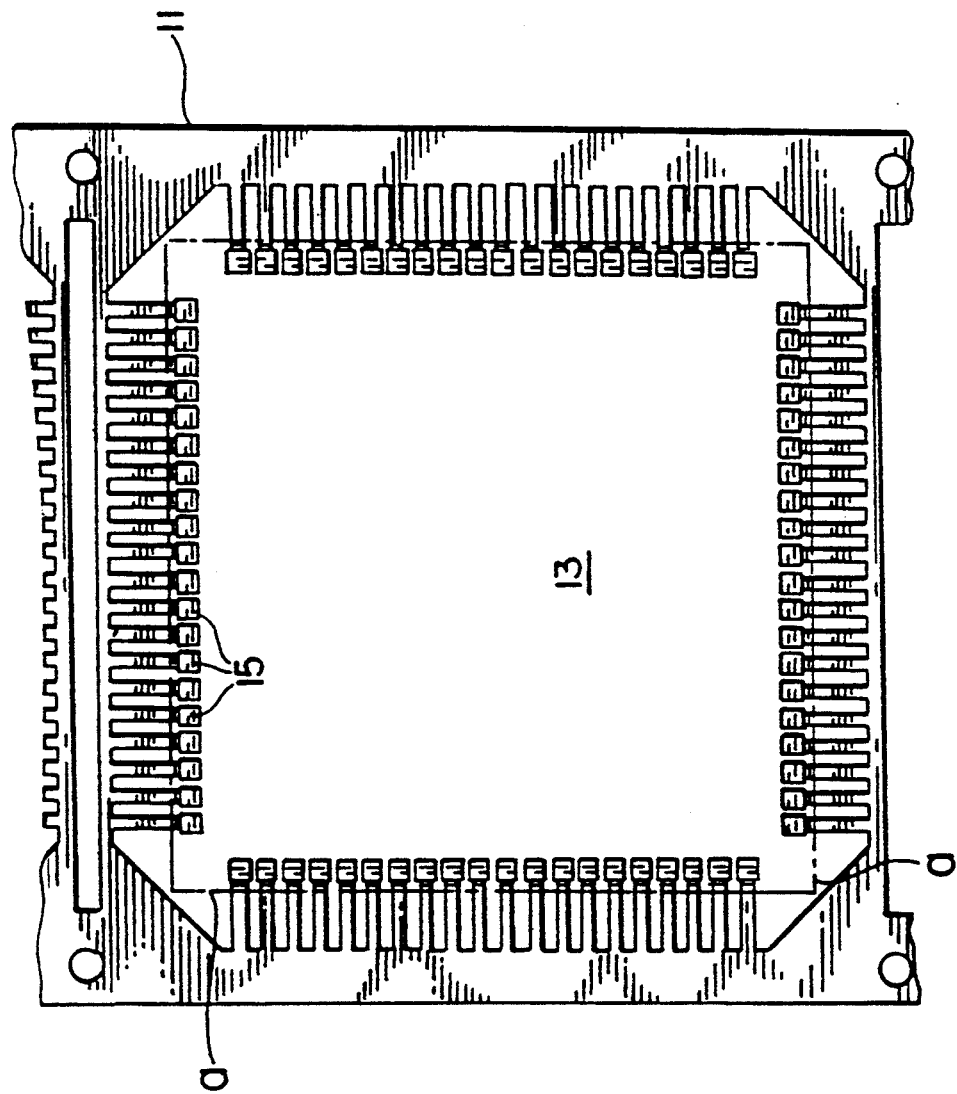
FIG. 1 is a top view of a fragment of a conductive strip having a prior art lead frame.

In the situation where a square or rectangular substrate, having conductive areas (called pads) on several or all edges, is to be provided with leads, a correspondingly spaced series of square or rectangular lead frames 11 has been provided in the prior art, as shown in FIG. 1, stamped from a continuous strip of metal. Each frame 11 has a central opening 13, with individual leads 15 extending inwardly from the rim of each side of the frame 11. The number and spacing of the leads 15 corresponds to the number and spacings of the conductive areas of the substrate to which the leads 15 are to be soldered.

In a known process, the contact pads of the substrate are supplied with a solder paste. The substrate is placed on the set of leads 15, the outline of the substrate being shown by the dotted lines $a$ in FIG. 1, with the contact pads of the substrate resting on the ends of the leads 15 to which solder has been applied. A separate pressure clamp is applied to hold the substrate in position relative to the frame, while heat is applied, either through the substrate or the leads, to melt the solder. The clamp must hold the frame/substrate assembly in locked position until the solder first melts and then cools to solidify, a cycle typically taking 15 to 20 seconds. Only after the solder solidifies can the frame/substrate assembly be moved out of the clamp at the soldering station.

Figure 2:
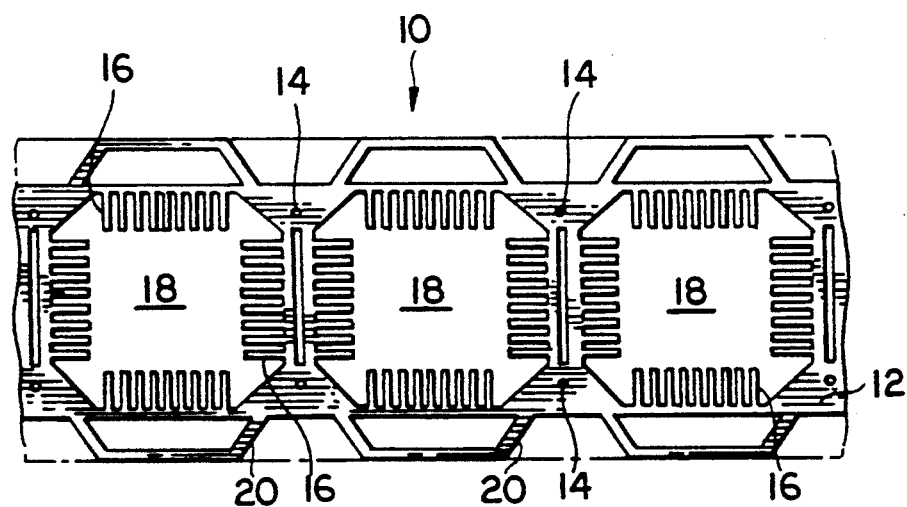
FIG. 2 is a top view of a portion of a strip of lead frames according to the invention.
Figure 6:
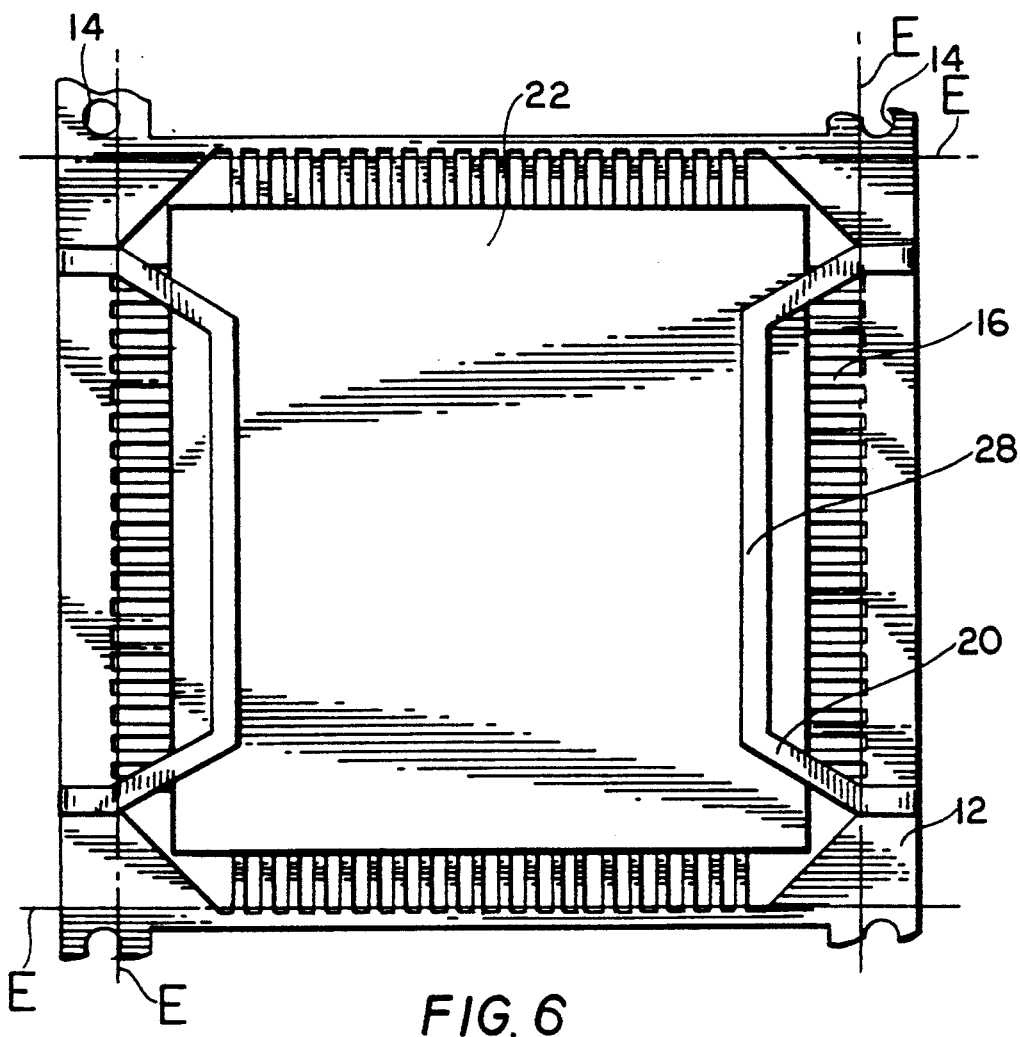
FIG. 6 is a top view of the lead frame/substrate assembly of FIG. 3 with the retaining arms engaged to the substrate.

Referring now to FIG. 2 of the drawings, a portion of a strip 10 carrying lead frames 12 according to the invention is shown. The individual lead frames 12 can be delineated by indexing holes 14 that are used by a conveyor or indexing apparatus (not shown) to move the strip 10 successively stepwise by a fixed distance corresponding to the frame length. Each individual lead frame 12 preferably is comprised of a number of leads 16 surrounding and extending into an interior opening 18. Each side of each frame is formed by a strip carrying a set of leads 16 extending into the frame. Two opposite sides also carry a retaining means, shown as a handle-like projection having a pair of arms 20. As shown below, when a substrate 22 is placed on the leads 16, the retaining means 20 may be engaged to the substrate 22 to hold the substrate 22 resiliently in place. This will be shown to be particularly useful to hold the substrate 22 in place while previously molten solder cools to form a physical and electrical bond between the substrate 22 and the leads 16.

Figure 3:
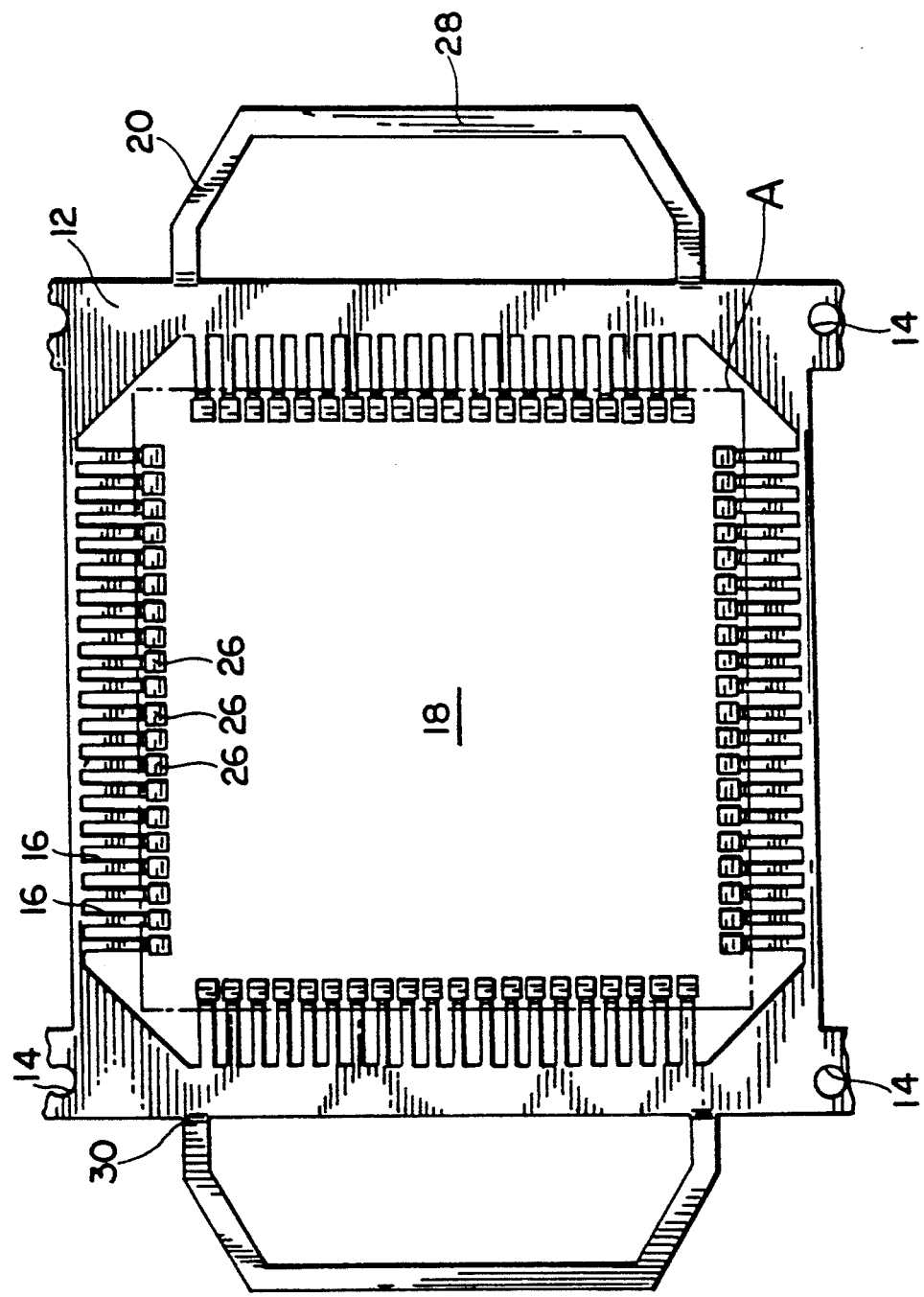
FIG. 3 is a top view of an individual lead frame according to the invention.

In FIG. 3, an individual lead frame 12 is shown in greater detail. The frame 12 may be fashioned in any shape so that its leads accommodate and match the pads of a particular substrate. In the illustrated embodiment, the frame 12 is provided with a square aperture 18, into which extend a number of leads 16, which are integral with the frame 12 at their proximal ends.

As described below, the leads 16 extending inwardly from the four sides of the frame 12 create a support for a substrate 22, which will fit in the position marked by the broken line A in FIG. 3. The substrate 22 may be any component having at least one conductive area or pad 24, such as an integrated circuit chip or chip carrier or printed circuit board. The leads 16 are positioned and designed such that the distal ends 26 of the leads 16 will be adjacent to respective conductive pads 24 on the substrate 22 when the substrate 22 rests at position A.

Each individual lead frame 12 also includes retaining means, which preferably extend outwardly from the lateral edges of the frame 12. Each of these retaining means 20 includes a pair of joined arms extending outwardly from the frame. The means 20, aperture 18, and leads 16 are formed by progressive stamping from a continuous strip of slightly resilient conductive metal (e.g. beryllium copper or phosphor bronze). Thus, in the preferred embodiment, the original blank strip will be at least as wide as the widest portion of the frame 12 and retainer 20. The original strip width is shown by dashed lines in FIG. 2. The retainer arms 20 may be separately formed and suitably attached to the frame 12.

Figure 8:
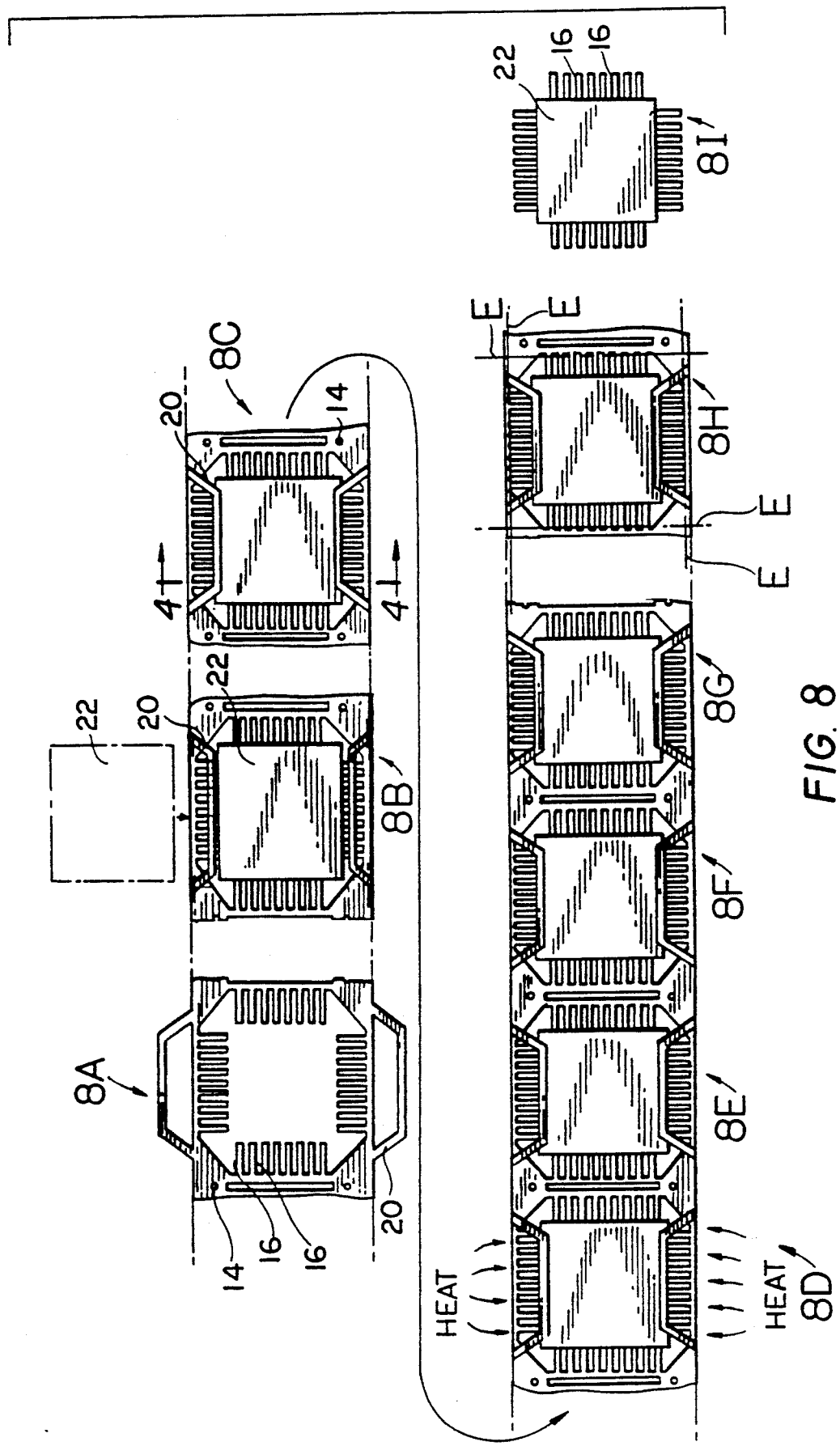
FIG. 8 is a schematic diagram showing the preferred method of use of the lead frame according to the invention.

The process of forming and attaching leads to substrates according to the present invention is shown schematically in FIG. 8. The various lead frame positions, from left to right in FIG. 8, show the progressive stages and operations that produce the final product, i.e., a circuit substrate 22 with a number of leads joined to and extending therefrom. These stages are merely illustrative of the operations on and status of a frame and its corresponding substrate as they are moved along by an appropriate indexing apparatus from workstation to workstation (not shown).

In stage or station 8$a$, a blank lead frame 12 is seen. The frame 12 may be supplied at that point individually from a hopper, but is preferably supplied from a reel or coil containing many frames joined in sequence. By the next stage 8$b$ the retaining means 20 have been partially folded over the leads 16, as seen in FIGS. 4 and 5.

FIG. 4 shows a cross-sectional side view of a lead frame 12. As seen in this figure, the retainer 20 and its arms, previously in position B (shown in broken lines) have been partially folded to position C. That position is determined so that the tips of the two opposed retainers 20 are separated by a distance greater than the corresponding dimension of the substrate, so that a substrate 22 may pass by the retainers 20 and be dropped into the position shown by the broken lines 22' in FIG. 4. FIG. 8 at stage 8$b$ shows this schematically. A substrate 22 is added, with its conductive pads 24 registering with and abutting the distal ends 26 of the leads 16. The substrates 22 may be added automatically to the frames 12 from a hopper, as each frame 12 successively arrives at station 8$b$. Solder 36 has preferably already been added to either the ends of the leads 16 or to the conductive pads 24, in a suitable manner, not shown.

Between position 8$b$ and position 8$c$, the retaining means 20 are folded down onto the substrate 22, as seen in FIG. 5, to prevent movement of the substrate 22 relative to the frame 12. As illustrated in FIG. 5, the retainers 20 have been moved from broken-line position C to position D, where they hold the substrate against the leads 16.

It will be seen in FIG. 5 that at the hinge or bending point 30 between the retaining means 20 and the frame 12, there is preferably a small circular bend 32. This is formed at an appropriate stage during the progressive stamping process or at the beginning of the arm-bending operation to cause the retaining means 20 to bend at the hinge point 30, rather than at a random point along their lengths. With the retainers 20 already at position C when the substrate 22 is added, crimping or compressing the hinge point 30 will cause the retainers 20 to engage and clamp the substrate 22. This creates a resilient force of the retainers 20 down on the substrate 22, sufficient to maintain the substrate 22 in position. In this way, no outside direct force is applied to the substrate 22, avoiding pressures that might crack it.

It can also be seen in FIG. 5 that the outermost edge 28 of the retaining arm 20 when folded over extends into opening 18 sufficiently to overlap and firmly engage the substrate 22. While the retaining means 20 are shown in the form of a loop or handle, they may be solid, or in the form of multiple outward extending stubs or fingers, or fashioned in any shape, provided only that when they are folded inward, as described, an outer portion 28 will engage the substrate 22 and hold it resiliently in place. It will be understood that the outer portion 28 is desirably straight as shown, but may be curved or corrugated, configured to engage a larger area of the substrate to hold it firmly against the leads 16.

Alternatively, the retainers 20 may be left in position B until after the substrate 22 is in place, and subsequently folded over the substrate, although this would add production time, since the folding operation can be more efficiently accomplished before the substrate is added.

As shown in FIG. 5, the leads 16 preferably have a slight bend or jog 34 near the distal end 26 to help properly position the substrate 22 as it comes to rest on the leads 16, although this is not essential.

In FIG. 5, which shows the conjunction of lead 16, the substrate 22 and a retainer 20 in greater detail, the lead 16, solder 36 and the conductive pad 24 can be seen in juxtaposition. The solder 36 may be a solder paste, applied to the upper surface of the distal ends 26 of the leads 16, or to the conductive pads 24 of substrate 22. Alternatively, to expedite the soldering process, solder masses may be pre-attached to the lead ends 26, in any suitable manner, as is common in making solder-bearing leads. Leads of this type are shown, for example in U.S. Pat. Nos. 4,120,558; 4,592,617 and 4,605,278; all to the present inventor. This is preferred, as the solder can be applied during the frame production process, avoiding extra steps during the substrate attachment process.

Returning to FIG. 8, at stage 8c, the substrate 22 is in position, held by retainers 28 as described in relation to FIG. 4 and 5. By having the downward resilient force of the retaining means 20 applied near the outer periphery of the substrate 22, the force will tend to keep each pad 24 in contact with its lead 16. Fashioning the retainer 20 to extend along the major part of the length of the substrate 22 causes a distribution of force and avoids local forces which may harmfully affect the substrate 22. The substrate 22 will generally be rigid enough so that its two edges not engaged by the retaining means 20 will not bend.

In this way, the substrate and lead frame are held as an assembly, with each lead in its proper position relative to a conductive pad, as shown in FIG. 5, ready for soldering.

The substrate/frame assembly may then be readily transported directly to a stage 8d, where heat is then applied to the substrate/frame assembly by any conventional means, such as a heat chamber surrounding stage 8d, or by hot gases impinging on the leads 16 at their ends 26. Usually about three to four seconds is sufficient for this. In the prior art, it was necessary thereafter to maintain the frame/substrate assembly at the heating stage in its heating clamp (with the heat turned off) for another 15 to 20 seconds while the solder cools sufficiently to solidify so that leads 16 are joined to the substrate strongly enough to be self-sufficient. With the retaining means 20 of the present invention, the assembly can be moved out of the heating chamber or stage 8d as soon as the solder has melted, without risk of the substrate 22 shifting relative to the frame. Once out of the chamber, the assembly will begin to cool. In the next 15 seconds or so, three to five more assemblies can be moved into the heating stage, heated and moved out. Thus, the throughput of a soldering station using the invention is a multiple of that of the prior art. This scenario assumes that the assemblies are heated one at a time in a single heating stage. If more than one is heated at a time, by multiple heating stages, the output is simply multiplied. Utilizing the present invention, it is also possible to maintain a constant temperature at the heating stage 8d, rather than constantly cycling a heating clamp by heating and allowing to cool. Positions 8e-8g show assemblies that have already been heated and are now cooling, while the substrate 22 of stage 8d is being heated.

An additional advantage of the retaining means 20 of the invention lies in their simplicity of release and disposal from the substrate 22. At a subsequent position 8h (FIG. 8), after the solder has solidified, the frame 12 is cut at the four dotted lines E to leave the leads 16 projecting from substrate 22. It can be seen that the arms of the retainer 20 will also be cut off by this operation. The retainers 20 are then discarded with the frame 12. At position 8I, the final product is seen— circuit substrate 22, with leads 16 extending therefrom, ready for connection to other electronic devices. Of course, discarded metal can be recycled to make a new strip 10, so essentially no extra material is needed for the retaining arms 20.

In FIG. 7, an alternate embodiment of the invention is shown, in which the outer edges 28 of the retaining means 20 are angled toward the lead frame 12. In operation, the retainers 20 are fashioned into the position shown in FIG. 7 before insertion of the substrate 22. Upon insertion of the substrate 22, the edges 28 contact the substrate 22 on its side surfaces. The arms of retainers 20 flex slightly, allowing the substrate 22 to pass, but frictionally engaging its sides This frictional force, combined with the resiliency of the retaining means 20, keeps the substrate 22 firmly in place on the leads 16. Heat is applied to the substrate/frame assembly at position 8d, melting the solder 36. Here again, because of the retaining means 20, the substrate 22 is held in fixed position with respect to the frame 12, permitting removal from the heating zone before re-solidification of the solder.

Figure 9:
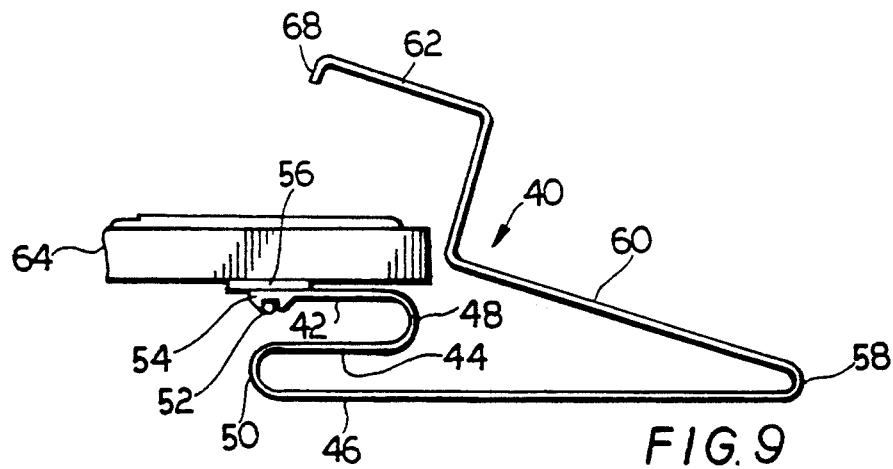
FIG. 9 is a side elevation view of a modified lead arrangement according to my invention positioned relative to a substrate.
Figure 10:
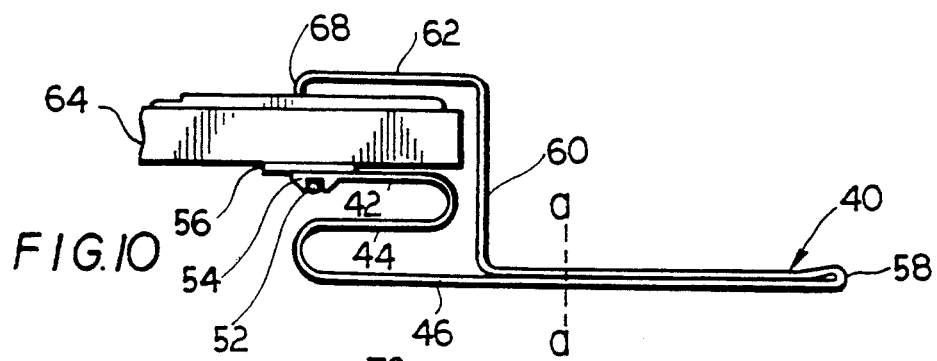
FIG. 10 shows a side elevation view of the lead arrangement of FIG. 9 held against the substrate.
Figure 11:
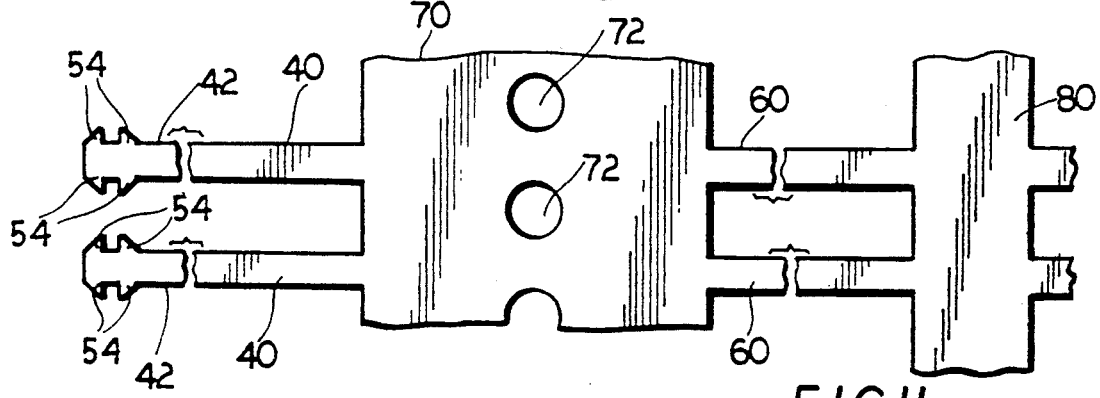
FIG. 11 shows a fragmentary plan view of a blank for the lead arrangement of FIGS. 9–10.

As indicated above, the present invention is not limited to lead frames, but may be used where one or more leads is to be applied to a substrate. Thus, where a substrate, such as a printed circuit board, may have only a single row of conducive areas, such as along one edge. An arrangement may be used which is generally similar to one side of the frame as seen in FIG. 2 with leads as shown in FIGS. 9 to 11. In addition, instead of the handle-like retaining means 20 shown in the foregoing FIGS. 2–8, the leads may have the retaining means shown in FIGS. 9 to 11.

FIGS. 9–11 show a modified form of lead arrangement usable to produce the resilient retention of one or more leads against the substrate in a different way. In this form, each lead has its own retainer means for holding it against its respective substrate conductive pad. FIG. 9 shows one such lead 40 in open position. The lead 40 is formed at its solderable end with an S-shaped configuration having an upper leg 42, a center leg 44, and a bottom leg 46. The upper leg 42 and center leg 44 are joined by a curved section or bend 48. Similarly, the central leg 44 and lower leg 46 are joined by a curved section or bend 50. The distal end of the upper leg 42 carries a solder preform or bead 52. In this instance the solder is held by means of lateral tabs 54 bent up from edges of the lead leg 42, although other ways of holding the solder may be used. Lower leg 46 is extended and joined by a bend 58 to a retaining arm 60 having a portion 62 adapted to extend over the substrate 64 when the substrate is laid on the upper leg 42 with a conductive area 56 juxtaposed to the solder-bearing end of the upper leg 42. It will be understood that usually there will be a linear array of such leads 40 joined to a carrier strip 70 seen in FIG. 11.

As seen in FIG. 9, when the retaining arm 60 is in the open position shown, the substrate 64 may be readily placed upon the legs 42 of the leads 40. If desired, the retaining arm 60 may be opened wider than as shown, to facilitate dropping a substrate 64 onto the legs 42. After the substrate is positioned, the retaining arm 60 has its bent end 68 placed against the upper surface of the substrate 64 by squeezing the angle between the lower leg 46 and the r 60 as seen in FIG. 10. By so doing, the substrate is resiliently clamped between the leg 46 and retaining arm end 68. This provides a resilient retention of the substrate pads in contact with the solder-bearing end of leg 46, the major resilient force holding each lead against the substrate being provided by the S-configuration described.

An exemplary blank for use in forming the leads of FIG. 9 or 10 is shown in FIG. 11, comprising a central supporting strip 70 with indexing holes 72. The array of leads 40 extend transversely from the blank supporting strip 70 and each terminates in lateral tabs 54, which are later bent up to hold the solder preform 52. Extending transversely to the center supporting strip 72 but oppositely from the leads 40 are the retaining arms 60. As seen in FIG. 11, the retaining arms 60 may be interconnected by an integral joining strip 80, preferably adjacent ends 68 of arms 60, for distribution of the resilient retaining force over the substrate. Alternatively, the portions of the joining strip 80 between arms 60 may be removed, leaving each arm 60 as a separate retaining means.

The lead arrangement of FIGS. 9-11 is used in a manner similar to the lead frame of FIGS. 2-8. The substrate is positioned on the array of legs 42 with the solder preforms registered with the substrate conductive pads. The leads are pressed about the substrate as seen in FIG. 10. The assembly is then heated to flow the solder between the leg 42 and pad 56. While the solder is still molten, the assembly may be moved out of the heating stage to speed up the production rate by allowing the next assembly to be heated. The solder is cooled outside the heating stage to solidify the solder and complete the electrical and mechanical connection of the leads to the substrate. The bottom legs 46 and the retaining arms 60 may be simultaneously removed after the solder has solidified, by cutting along a line such as a—a, positioned at any desired location along legs 46. As is conventional, notches may be formed on each leg 46 and arm 60 to permit ready breaking off of the undesired portions at line a—a.

It will be seen that the arrangements of FIGS. 9 to 11 provide the resilient retention in a different manner from that of FIG. 3; that is, instead of providing resiliency by a bending section joining the retaining arm to the lead, resiliency is provided at the end of the lead itself, as by an S-configuration.

Figure 12:
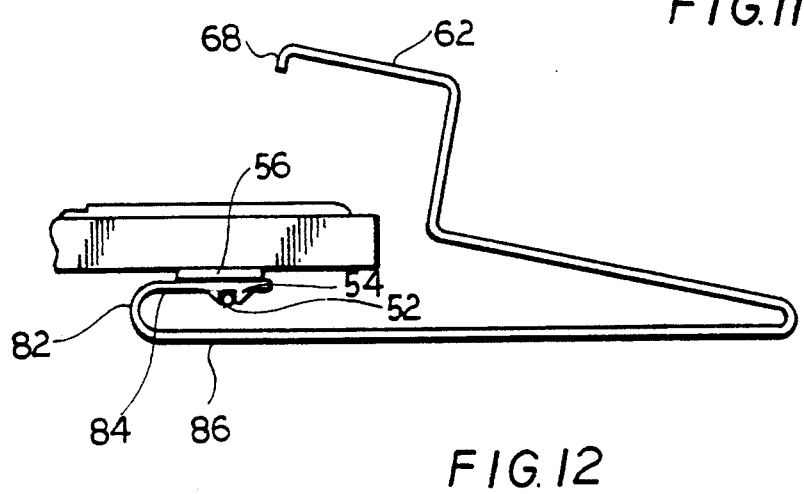
FIG. 12 shows a side elevation view similar to FIG. 9 of another modification of the invention.

An alternate form of providing resilient retention is illustrated in FIG. 12 in which each lead 80 is provided with but a single bend 82 between its legs 84 and 86, instead of the double or S-bend of FIG. 9.

It will be understood that the forms of leads shown in FIGS. 9 to 12 may be utilized in each side of the lead frame arrangement of FIGS. 2 to 8, or may be used to apply a linear row of leads to a linear row of conductive areas on a substrate.

In the arrangements of FIGS. 9 to 12 it will be understood that a large coil of leads with integral retaining means joined to a continuous support strip 70 may be utilized, permitting cutting off as many leads from the coil as may be needed to accommodate the particular number of conductive areas on the substrate. In this way the same coil of leads may be used for substrates having differing numbers of conductive areas along its edge.

The arrangements shown in FIGS. 9 to 12 may be applied to various edges of a substrate, instead of using the grid frame shown in FIG. 2 and FIG. 3. A strip of such leads may be applied sequentially to each of the edges of a substrate having conductive areas along more than one edge. After all of the edges with conductive areas are resiliently joined to the lead strip arrangement, soldering would take place as described above. The retaining arrangement nevertheless serves to hold the substrate in position with the leads until the solder has cooled even after the substrate is removed from the heating area.

While the embodiments of the invention shown and described are all capable of achieving the results desired, it is to be understood that these embodiments have been shown and described for purposes of illustration only and not for purposes of limitation, the present invention being defined by the appended claims.

What is claimed is:

1. A lead arrangement for connecting one or more leads to a circuit substrate, comprising:
  a supporting strip;
  one or more conductive electrical leads, each having first and second ends, each of said leads having its first end joined integrally with said strip and extending transversely from one edge of said strip; and
  means joined to said strip along the opposite edge of said strip for resiliently urging said substrate against and in contact with the second ends of said leads.

2. A lead arrangement as in claim 1 further comprising a solder mass held by the second end of each of said leads for soldering said second end to a respective conductive area of said substrate.

3. A lead arrangement as in claim 1, wherein said substrate has conductive areas, each of said leads also having its second end free, the positions of said second ends corresponding to respective positions of said conductive areas.

4. A lead arrangement as in claim 3, wherein said retaining means is adapted to hold said substrate on said lead such that said conductive areas are juxtaposed to respective second lead ends.

5. A lead arrangement as in claim 1 wherein at least one of said arms are connected together adjacent their ends remote from said strip.

6. A lead arrangement as in claim 1, wherein each said retaining arm is adapted to be folded over said substrate to hold said substrate against said leads.

7. A lead arrangement as in claim 6, wherein one of (a) said second lead ends and (b) said conductive areas bears solder material, said retaining means being adapted to maintain the relative position of said conductive areas with said second ends when said solder is in a liquid state.

8. A lead arrangement as in claim 7, wherein said solder material is carried by said second lead ends.

9. A lead arrangement as in claim 6 wherein said retaining arms have a resilient section for resiliently holding a substrate in relation to said leads.

10. A lead arrangement as in claim 1 wherein each said second lead end has a section with a first leg, a second leg generally parallel to said first leg, and a curved portion joining said legs, whereby said substrate may be resiliently held between said retaining means and said lead.

11. A lead arrangement as in claim 10 wherein said second lead ends have a further section with a third leg generally parallel to said first and second legs and joined to said second leg by a second curved portion to form a substantially S-shaped lead end.

12. A lead arrangement for connecting one or more leads to a circuit substrate, comprising:
a supporting strip;
one or more conductive electrical leads, each having first and second ends, each of said leads having its first end joined integrally with said strip; and
means joined to said strip for resiliently retaining said substrate in contact with the second ends of said leads;
wherein said retaining means comprises at least one retaining arm extending from said strip in a direction away from said leads, and
wherein said retaining arms are adapted to be folded over said substrate to hold said substrate in relation to said leads; and
wherein a portion of at least one of said retaining arms when folded is adjacent the first end of at least one of said leads, such that said strip and retaining arms may be severed simultaneously from said leads.

13. A method for simultaneously connecting a plurality of leads to a circuit substrate, comprising the steps of:
providing a strip of resilient conductive material having a plurality of leads extending therefrom from one edge, each of said leads being connected to said strip at a first end and having a free second end, said substrate having conductive areas at positions corresponding to said free second lead ends;
forming means on said strip extending outwardly of said strip from one edge thereof opposite said one edge for holding said substrate to said leads;
providing solder on either said second lead ends or said conductive areas;
positioning said substrate on said strop such that said conductive surfaces are juxtaposed respectively to said second ends with solder therebetween; and
thereafter engaging said retaining means to resiliently hold said substrate in said position.

14. A method as in claim 13 further including the steps of
heating said solder to cause it to melt; and
maintaining the relative position of said substrate and said leads by said retaining means while said solder is being heated to a molten state.

15. A method as in claim 14 wherein said position maintaining is also performed away from the position where said heating occurs.

16. A method as in claim 13 further including
heating said solder at a first location to cause it to melt,
moving said substrate and leads from said first location to a second location while the solder is still molten, and
maintaining the relative positions of said substrate and said leads while said solder is allowed to solidify.

17. A method as in claim 14, further comprising the step of:
detaching said leads from said strip and simultaneously detaching said holding means from said substrate.

18. A method as in claim 13, further comprising forming said retaining means as individual arms integral with said strip.

19. A method for simultaneously connecting a plurality of leads to a circuit substrate, comprising the steps of:
providing a strip of resilient conductive material having a plurality of leads extending therefrom, each of said leads being connected to said strip at a first end and having a free second end, said substrate having conductive areas at positions corresponding to said free second lead ends;
forming means on said strip extending outwardly of said strip for holding said substrate to said leads;
providing solder on either said second lead ends or said conductive areas;
positioning said substrate on said strip such that said conductive surfaces are juxtaposed respectively to said second ends with solder therebetween;
engaging said retaining means to resiliently hold said substrate in said position;
forming said retaining means as individual arms integral with said strip; and
folding said arms over said substrate.

20. A method of manufacturing a lead arrangement, comprising the steps of:
forming at least one lead integral with a strip of resilient conductive material and extending transversely of said strip from one edge of said strip, said leads corresponding to at least one conductive area of a substrate;
forming retaining means integral with said strip and extending transversely of said strip from the other edge of said strip oppositely to said leads, said retaining means being adapted to retain said substrate in contact with said leads when said substrate engages said leads and said retaining means is folded over said substrate.

21. A method of joining a substrate to a lead arrangement, wherein said arrangement has a strip of resilient conductive material with one or more leads extending transversely from one edge of said strip, each said lead corresponding to a respective conductive area on said substrate, said strip also having integral therewith means extending transversely from the other edge of thereof oppositely from said leads from retaining said substrate on said leads, comprising the steps of:

placing said substrate on said leads, with solder between each said conductive area and a respective lead;

engaging said retaining means over said substrate to hold each said lead resiliently in juxtaposition to its respective conductive area;

applying heat to melt said solder at a workstation;

moving said substrate and lead arrangement out of said workstation before cooling to permit insertion of another substrate and lead arrangement into said workstation; and allowing said substrate and lead arrangement to cool away from said work station.

22. A blank for a lead arrangement for a substrate having at least one conductive area, comprising a strip of conductive resilient material, at least one lead extending transversely from said strip, each said lead having a proximal end joined integrally to said strip and also having a distal end, a retaining arm extending transversely from said strip oppositely to at least one of said leads, said arm having a proximal end integral with said strip and also having a distal end, said arm being adapted to be bent to a position wherein said arm distal end is adjacent to said lead distal end with a gap therebetween sufficient to accommodate said substrate therein, so that the substrate's conductive area may be juxtaposed to a respective lead distal end.

23. A blank as in claim 22 wherein said lead distal end has an arrangement for retaining a solder mass thereon.

24. A lead arrangement comprising a blank as in claim 22 and further comprising a bend formed in each said lead adjacent its distal end and providing a flexible arrangement.

25. A blank as in claim 22 further comprising a joining strop connecting said retaining arms.

* * * * *